(12) United States Patent
Arahira

(10) Patent No.: US 6,542,522 B1
(45) Date of Patent: Apr. 1, 2003

(54) MODE LOCKING SEMICONDUCTOR LASER

(75) Inventor: Shin Arahira, Tokyo (JP)

(73) Assignee: Oki Electric Industry, Co., Ltd., Tokyo (JP)

(*) Notice: Subject to any disclaimer, the term of this patent is extended or adjusted under 35 U.S.C. 154(b) by 0 days.

(21) Appl. No.: 09/576,903

(22) Filed: May 23, 2000

(30) Foreign Application Priority Data

May 24, 1999 (JP) ............................................. 11-142684

(51) Int. Cl.[7] .............................................. H01S 3/098
(52) U.S. Cl. ............................................ 372/18; 372/23
(58) Field of Search ............................. 372/23, 38, 25, 372/18; 331/94.5

(56) References Cited

U.S. PATENT DOCUMENTS

| | | | |
|---|---|---|---|
| 3,869,680 A | * 3/1975 | Fletcher et al. | 372/18 |
| 5,175,737 A | * 12/1992 | SooHoo | 372/13 |
| 5,854,804 A | * 12/1998 | Winer et al. | 372/18 |
| 6,018,536 A | * 1/2000 | Alphonse | 372/18 |
| 6,333,942 B1 | * 12/2001 | Nakazawa et al. | 372/18 |

OTHER PUBLICATIONS

"Passive and hybrid modelockings in a multi–electrode DBR laser with two gain sections", *Electronic Letters*, May 11, 1995, vol. 31, No. 10, pp. 808–809.
Transcripts of the 59th Applied Physics Academy Lectures, Fall Term V.1.0, (1998), "Yoshida and Nakazawa; Ultrashort pulse generation with a high repetition rate from soliton fiber laser".
Transcripts of the 59th Applied Physics Academy Lectures, Fall Term V.10, (1998), "Y. Ogawa Mode–locked Semiconductor Lasers and It's Application to Soliton Transmission".

* cited by examiner

*Primary Examiner*—Paul Ip
*Assistant Examiner*—Hung Vy
(74) *Attorney, Agent, or Firm*—Venable; Norman N. Kunitz

(57) ABSTRACT

In a mode locking semiconductor laser that generates an ultra short optical pulse train with a frequency corresponding to a reference frequency, an active wave guiding channel to which a modulation signal at the reference frequency is applied, a passive wave guiding channel which is transparent to oscillation light and an ohmic resistance heating film provided over the passive wave guiding channel that generates Joule heat based upon an current injected thereto and changes the refractive index of the passive wave guiding channel to change the optical length are formed to constitute an optical resonator. In addition, a photoelectric transducer that converts the ultra short optical pulse train to an electrical signal and a phase comparator that compares the phase of the electrical signal and the phase of the modulation signal and detects the frequency deviation of the ultra short optical pulse train relative to the reference frequency based upon the phase difference between them are provided, and the current injected into the ohmic resistance heating film is changed so as to eliminate the frequency deviation detected by the phase comparator. Thus, even when a disturbance occurs due to heat and the like, the optical length of the resonator is adjusted to stabilize the mode locking frequency and to generate a stable ultra short optical pulse train over a long period of time.

16 Claims, 4 Drawing Sheets

MODE LOCKING SEMICONDUCTOR LASER

BACKGROUND OF THE INVENTION

1. Field of the Invention

The present invention relates to a mode locking semiconductor laser apparatus employed in long distance, large capacity optical fiber communication or the like to generate an ultra short optical pulse train.

2. Description of the Related Art

The prior art technologies in this field include those disclosed in the following publications:

Reference 1; ELECTRONICS LETTERS 31 (10) (May 11, 1995)

A. Asahira and Y. Ogawa; "Passive and Hybrid Mode Locking in a Multi-Electrode DBR Laser with Two Gain Sections" page 808~809

Reference 2; Transcripts of the 59th Applied Physics Academy Lectures, Fall term V.1.0, (1998)

Yoshida and Nakazawa; Ultrashort pulse generation with a high repetition rate from a soliton fiber laser"

Methods of generating ultra short optical pulse trains in the prior art include the mode locking method. In the mode locking method, an optical pulse train is generated by lasing light in multi-longitudinal modes and locking the phases of the individual longitudinal modes. To achieve mode locking by locking the phases of the longitudinal modes, it is necessary to assume a structure of a resonator and to modulate the gain or the loss in the resonator with an orbital frequency determined in conformance to the length of the resonator or a frequency that is achieved by multiplying the orbital frequency by an integer (hereafter, these frequencies are referred to as mode locking frequencies).

The hybrid mode locking method achieved by applying a modulation voltage with a frequency that roughly matches a mode locking frequency to a saturable absorber is a type of mode locking method. By adopting the hybrid mode locking method, the pulse width suppression effect achieved by the saturable absorber and the advantage of time jitter reduction achieved by applying the modulation voltage are realized at the same time so that an ultra short optical pulse train with little time jitter can be generated. In reference 1 above, a semiconductor laser constituted by integrating a saturable absorber, a gain area and a diffraction grating is employed and a reverse bias voltage is modulated by using the orbital frequency (8.68 GHz) and then is applied to the saturable absorber, to successfully generate an ultra short optical pulse train with a pulse width at 8.3 ps and a low time jitter of 0.2 ps.

A mode locking frequency, which is determined by the optical length of the resonator constituting the laser, may fluctuate due to a change in the optical length of the resonator resulting from disturbances such as heat from the outside. Such a fluctuation in the mode locking frequency is not desirable since it may cause an error in signal identification on the reception side in an optical communication system, for instance. In reference 2, a fiber laser type regenerating mode locking laser is disclosed. In this regenerating mode locking laser, a frequency deviation relative to the frequency generated by a reference frequency generator such as a synthesizer is detected by adopting a PLL (phase locked loop). Then, by performing fine adjustment on the fiber loop length, which is equivalent to the resonator length, so as to correct the frequency deviation, a stable fiber laser type mode locking laser that sustains a constant mode locking frequency over long period of time is provided.

SUMMARY OF THE INVENTION

As described above, a semiconductor laser which promises to be ideal in application as the light source in optical communication and optical information processing not only needs to generate an ultra short optical pulse train with a low time jitter but also is required to withstand a thermal disturbance and the like and to output a stable, ultra short optical pulse train over a long period of time.

Accordingly, in the mode locking semiconductor laser that generates an ultra short optical pulse train having a frequency corresponding to a reference frequency in a first embodiment of the present invention, an optical resonator is constituted by forming an active wave guiding channel to which a modulation signal at the reference frequency is applied, a passive wave guiding channel that is transparent to oscillated light and an ohmic resistance heating film is provided over the passive wave guiding channel that generates Joule heat based upon an injected current and changes the refractive index of the passive wave guiding channel to change the optical length, and the following structure is assumed.

Namely, it is provided with a photoelectric transducer that converts the ultra short optical pulse train to an electrical signal and a phase comparator that compares the phases of the electrical signal and the modulation signal and detects the deviation of the frequency of the ultra short optical pulse train relative to the reference frequency based upon their phase difference, and the current injected into the ohmic resistance heating film is changed so as to eliminate the frequency deviation detected by the phase comparator.

By adopting this structure, the mode locking semiconductor laser operates while achieving hybrid mode locking and generates an ultra short optical pulse train with a frequency corresponding to the reference frequency. If the optical length of the resonator changes due to a disturbance caused by heat or the like, the phase comparator detects a frequency deviation in the frequency of the ultra short optical pulse train relative to the reference frequency in correspondence to the phase difference between the electrical signal output by the photoelectric transducer and the modulation signal and the current injected into the ohmic resistance heating film is controlled so as to eliminate this frequency deviation. In other words, the optical length is adjusted.

The ohmic resistance heating film may be constituted of Pt (platinum), Ti (titanium), an alloy of Pt and Ti or the like. The injected current may be varied by using a variable resister or by changing a source voltage that generates the injected current. In addition, a filter that allows the frequency component corresponding to the mode locking frequency of the electrical signal to pass may be provided between the photoelectric transducer and the phase comparator.

In the mode locking semiconductor laser that generates an ultra short optical pulse train having a frequency corresponding to a reference frequency in a second embodiment of the present invention, an optical resonator is constituted by forming an active wave guiding channel to which a modulation signal at the reference frequency is applied, a passive wave guiding channel, which is transparent to oscillated light and ohmic resistance heating film provided over the passive wave guiding channel that generates Joule heat based upon an injected current and changes the refractive index of the passive wave guiding channel to change the optical length, and the following structure is assumed.

Namely, it is provided with a phase comparator that compares the phases of the photoelectric current flowing through the active wave guiding channel and the modulation signal applied to the active wave guiding channel and detects the frequency deviation of the photoelectric current and the modulation signal based upon their phase difference, and the current injected into the ohmic resistance heating film is changed so as to eliminate the frequency deviation detected by the phase comparator.

By adopting this structure, operation is performed while achieving hybrid mode locking and an ultra short optical pulse train with a frequency corresponding to the reference frequency is generated. If the optical length of the resonator changes due to a disturbance caused by heat or the like, the phase comparator detects a frequency deviation in the frequency of the ultra short optical pulse train relative to the reference frequency in correspondence to the phase difference between the photoelectric current flowing through the active wave guiding channel and the modulation signal, and the current injected into the ohmic resistance heating film is controlled so as to eliminate this frequency deviation. In other words, the optical length is adjusted.

The ohmic resistance heating film may be constituted of Pt, Ti, an alloy of Pt and Ti or the like. The injected current may be varied by using a variable resistor or by changing a source voltage that generates the injected current. In addition, an amplifier that amplifies the photoelectric current to flow through the active wave guiding channel may be provided between the active wave guiding channel and the phase comparator.

In the mode locking semiconductor laser that generates an ultra short optical pulse train having a frequency corresponding to a reference frequency in a third embodiment of the present invention, an optical resonator is constituted by forming an active wave guiding channel to which a modulation signal at the reference frequency is applied and a passive wave guiding channel, which is transparent to oscillated light and by applying a control voltage to the passive wave guiding channel that changes the refractive index in order to change the optical length, and the following structure is assumed.

Namely, it is provided with a photoelectric transducer that converts the ultra short optical pulse train to an electrical signal and a phase comparator that compares the phases of the electrical signal and the modulation signal and detects the deviation of the frequency of the ultra short optical pulse train relative to the reference frequency based upon their phase difference, and the control voltage is changed so as to eliminate the frequency deviation detected by the phase comparator.

By adopting this structure, the mode locking semiconductor laser operates while achieving hybrid mode locking and generates an ultra short optical pulse train with a frequency corresponding to the reference frequency. If the optical length of the resonator changes due to a disturbance caused by heat or the like, the phase comparator detects a frequency deviation in the frequency of the ultra short optical pulse train relative to the reference frequency in correspondence to the phase difference between the electrical signal output by the photoelectric transducer and the modulation signal and the control voltage is changed so as to eliminate this frequency deviation. In other words, the optical length is adjusted.

It is to be noted that a filter that allows the frequency component corresponding to the mode locking frequency of the electrical signal to pass may be provided between the photoelectric transducer and the phase comparator.

In the mode locking semiconductor laser that generates an ultra short optical pulse train having a frequency corresponding to a reference frequency in a fourth embodiment of the present invention, an optical resonator is constituted by forming an active wave guiding channel to which a modulation signal at the reference frequency is applied and a passive wave guiding channel, which is transparent to oscillated light and applying a control voltage to the passive wave guiding channel that changes the refractive index to change the optical length, and the following structure is assumed.

Namely, it is provided with a phase comparator that compares the phases of the photoelectric current flowing through the active wave guiding channel and the modulation signal applied to the active wave guiding channel and detects the frequency deviation of the photoelectric current and the modulation signal based upon their phase difference, and the control voltage is changed so as to eliminate the frequency deviation detected by the phase comparator.

By adopting this structure, operation is performed while achieving hybrid mode locking and an ultra short optical pulse train with a frequency corresponding to the reference frequency is generated. If the optical length of the resonator changes due to a disturbance caused by heat or the like, the phase comparator detects a frequency deviation of the frequency of the ultra short optical pulse train relative to the reference frequency in correspondence to the phase difference between the photoelectric current flowing through the active wave guiding channel and the modulation signal, and the control voltage is controlled so as to eliminate this frequency deviation. In other words, the optical length is adjusted.

It is to be noted that an amplifier that amplifies the photoelectric current to flow through the active wave guiding channel may be provided between the active wave guiding channel and the phase comparator.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is of a detailed explanation of the preferred embodiments of the present invention, given in reference to the attached drawings.

First Embodiment

Figure 1:
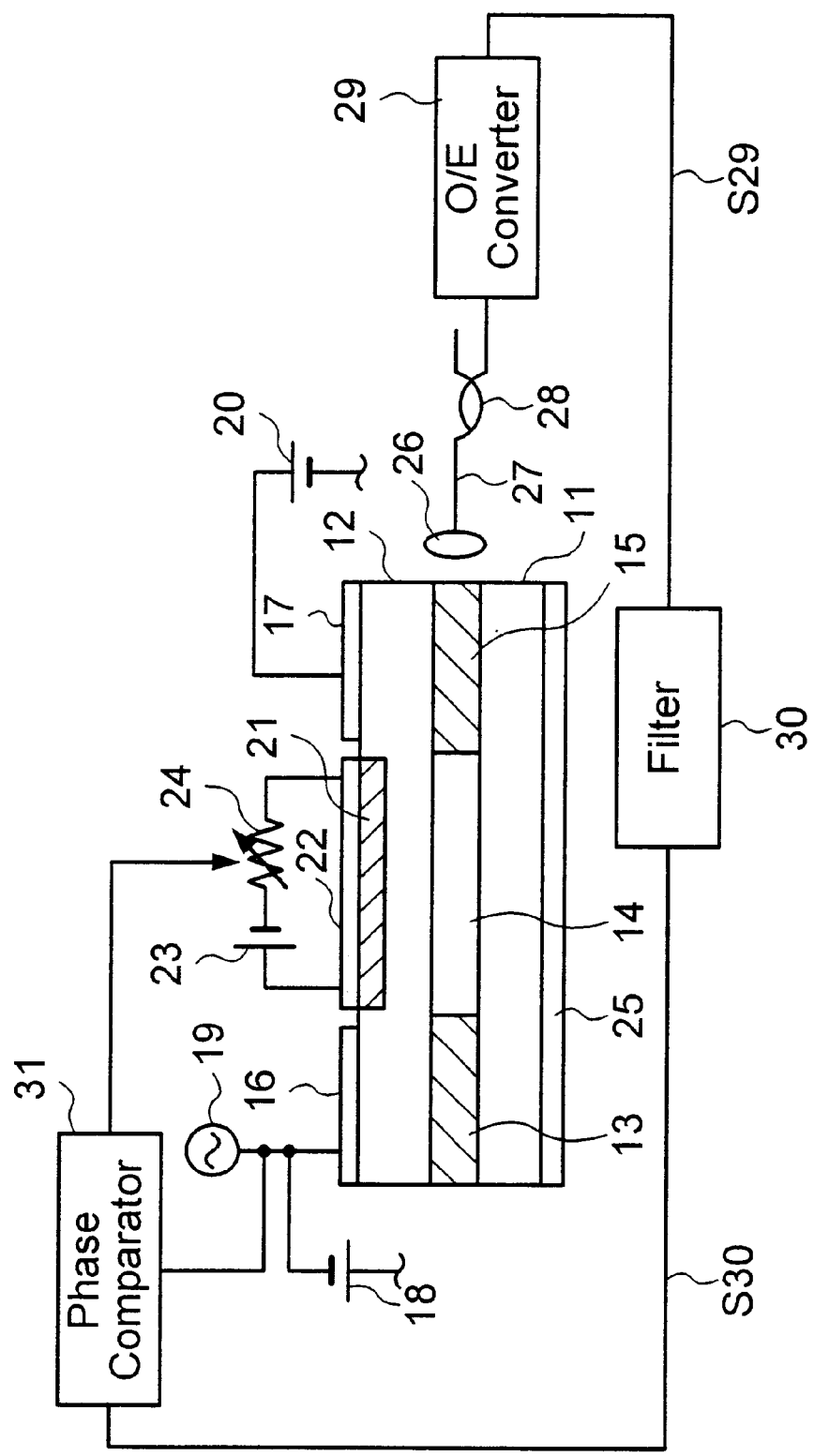
FIG. 1 is a block diagram of the mode locking semiconductor laser in the first embodiment of the present invention.

FIG. 1 is a block diagram of a portion of the mode locking semiconductor laser in the first embodiment of the present invention.

This mode locking semiconductor laser, which outputs an ultra short optical pulse train, is provided with a saturable absorber 13, a passive wave guiding channel 14 and a gain area 15 enclosed by a lower N-type clad layer 11 and an upper P-type clad layer 12 to constitute a resonator. The saturable absorber 13 and the gain area 15 are each constituted of an active wave guiding channel. The passive wave guiding channel 14, which achieves a band gap wavelength that is sufficiently shorter than the wavelength of the laser oscillation light, is transparent to the laser oscillation light and is provided between the saturable absorber 13 and the gain area 15.

A P-side electrode 16 for the saturable absorber is formed at the surface of the P-type clad layer 12 at a position over the saturable absorber 13. A P-side electrode 17 for the gain area is formed at the surface of the P-type clad layer 12 at a position over the location of the gain area 15. A reverse bias voltage source 18 and a modulation voltage source 19 are connected to the P-side electrode 16 for the saturable absorber. The modulation voltage source 19 generates a modulation signal at the reference frequency. A gain area current source 20 is connected to the P-side electrode 17 for the gain area. At the surface of the P-type clad layer 12 ranging over the passive wave guiding channel 14, an insulating film 21 is formed. And ohmic resistance heating film 22 constituted of a Ti (titanium)/Pt (platinum) thin film is formed on the insulating film 21. The ohmic resistance heating film 22 controls the refractive index of the passive wave guiding channel 14 by converting an injected electrical current to heat, and is connected with an ohmic resistance heating film source 23 that generates the current to be injected and a variable resistor 24. At the rear surface of the N-type clad layer 11, a common electrode 25 is formed.

At the side surface of the semiconductor laser toward the gain area 15, an optical coupling lens 26 is provided to couple the gain area 15 and a pigtail optical fiber 27. An optical coupler 28 is provided on the output side of the pigtail optical fiber 27. The optical coupler 28 is provided with two output terminals, through one of which the light output from the semiconductor laser is output to the outside and through the other of which light is delivered to a photoelectric transducer (hereafter referred to as an O/E converter) 29. The output side of the O/E converter 29 is connected to a filter 30, with the output side of the filter 30 connected to one of the input terminals of a 2-input phase comparator 31. The filter 30 allows the frequency component corresponding to the mode locking frequency to pass. The other input terminal of the phase comparator 31 is connected to the output terminal of the modulation voltage source 19. The output terminal of the phase comparator 31 is connected to the variable resistor 24. The phase comparator 31 is capable of performing adjustment to eliminate the phase difference between the output signal from the filter 30 and the signal at the reference frequency generated by the modulation voltage source 19 by controlling the current flowing through the ohmic resistance heating film 22.

Next, the operation achieved in the mode locking semiconductor laser illustrated in FIG. 1 is explained.

A negative DC voltage from the reverse bias voltage source 18 and a sine wave modulation voltage from the modulation voltage source 19 are superimposed upon each other and then applied to the P-side electrode 16 for the saturable absorber. The current from the gain area current source 20 is injected into the P-side electrode 17 for the gain area, to provide an optical gain to the laser oscillation light. As a result, an optical pulse train with a low time jitter having undergone pulse width suppression is generated through a hybrid mode locking operation. The optical pulse train is output to the outside via the lens 26, the pigtail optical fiber 27 and the optical coupler 28, and is also input to the O/E converter 29. Having the optical pulse train input therein, the O/E converter 29 outputs an electrical signal S29 with a frequency corresponding to the cyclic frequency of the optical pulse train to the filter 30. The filter 30 allows a component S30 of the signal S29 corresponding to the mode locking frequency to pass and provides it to the phase comparator 31.

When a current, the level of which is determined by the variable resistor 24, is supplied from the ohmic resistance heating film source 23 to the ohmic resistance heating film 22, Joule heat is generated. The Joule heat generated at the ohmic resistance heating film 22 raises the temperature of the passive wave guiding channel 14 to change its refractive index. At this time, the optical length of the resonator in the semiconductor laser changes and, as a result, the mode locking frequency also changes. Since the optical loss at the passive wave guiding channel 14 remains unchanged even when the refractive index changes, the pulse characteristics such as the pulse width and the pulse intensity do not change either. Thus, only the mode locking pulse frequency changes.

When the mode locking frequency fluctuates due to heat or the like, a difference occurs between the frequency at the modulation voltage source 19 and the frequency of the component S30. The phase comparator 31 detects the difference between the frequency at the modulation voltage source 19 and the frequency of the component S30, and changes the current flowing through the ohmic resistance heating film 22 by changing the resistance value at the variable resistor 24 so as to correct the phase difference between them. Consequently, the refractive index of the passive wave guiding channel 14 changes to suppress a change in the mode locking frequency.

As described above, in the first embodiment, the mode locking semiconductor laser having the ohmic resistance heating film 22 is provided with the O/E converter 29, the filter 30 and the phase comparator 31. Even when the mode locking frequency changes, a current which suppresses the change is supplied to the ohmic resistance heating film 22 by employing these components. Thus, the mode locking frequency is stabilized, and a stable, ultra short optical pulse train is generated over a long period of time. Consequently, advantages such as prevention of erroneous signal identification in an optical communications system, for instance, can be achieved.

Second Embodiment

Figure 2:
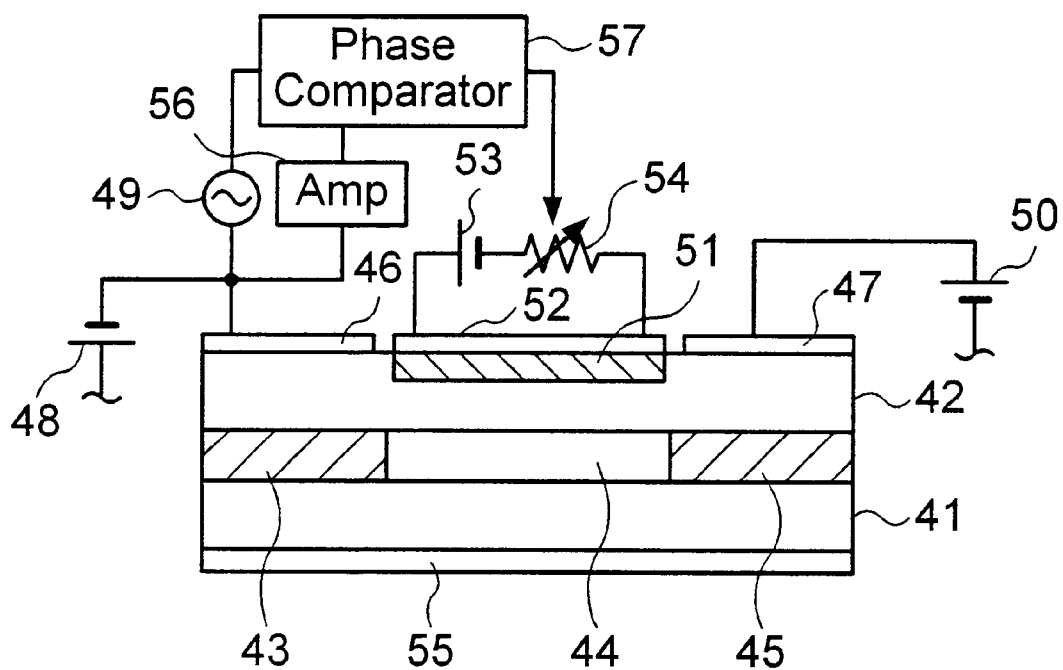
FIG. 2 is a block diagram of the mode locking semiconductor laser in the second embodiment of the present invention.

FIG. 2 is a block diagram of a portion of the mode locking semiconductor laser in the second embodiment of the present invention;

This mode locking semiconductor laser, which outputs an ultra short optical pulse train, is provided with a saturable absorber 43, a passive wave guiding channel 44 and a gain area 45 enclosed by a lower N-type clad layer 41 and an upper P-type clad layer 42 to constitute a resonator, as in the first embodiment. The saturable absorber 43 and the gain area 45 are each constituted of an active wave guiding channel. The passive wave guiding channel 44, which achieves a band gap wavelength that is sufficiently shorter than the wavelength of the laser oscillation light, is transparent to the laser oscillation light and is provided between the saturable absorber 43 and the gain area 45.

A P-side electrode 46 for the saturable absorber is formed at the surface of the P-type clad layer 42 at a position over the saturable absorber 43. A P-side electrode 47 for the gain area is formed at the surface of the P-type clad layer 42 at a position over the gain area 45. A reverse bias voltage source 48 and a modulation voltage source 49 are connected to the P-side electrode 46 for the saturable absorber. The modulation voltage source 49 applies a modulation signal with a reference frequency to the saturable absorber 43 via the P-type clad layer 42. A gain area current source 50 is connected to the P-side electrode 47 for the gain area. An insulating film 51 is formed at the surface of the P-type clad layer 42 ranging over the passive wave guiding channel 44. An ohmic resistance heating film 52 constituted of a Ti (titanium)/Pt (platinum) thin film is formed on the insulating film 51. The ohmic resistance heating film 52 changes the refractive index of the passive wave guiding channel 44 by converting an injected current to heat, and is connected with an ohmic resistance heating film source 53 that generates the current to be injected and a variable resistor 54. At the rear surface of the N-type clad layer 41, a common electrode 55 is formed over the entire rear surface.

The mode locking semiconductor laser is further provided with an amplifier (Amp) 56 that detects and amplifies the photoelectric current flowing through the saturable absorber 43. The output side of the amplifier 56 is connected to one of the input terminals of a phase comparator 57 having two input terminals. The other input terminal of the phase comparator 57 is connected to the modulation voltage source 49. The output side of the phase comparator 57 is connected to the variable resistor 54. The variable resistor 54 constitutes a means for control that controls the current flowing through the ohmic resistance heating film 52, and its resistance value changes in correspondence to the output signal from the phase comparator 57 so as to eliminate the phase difference between the photoelectric current and the modulation signal at the reference frequency generated by the modulation voltage source 49.

Next, the operation achieved in the mode locking semiconductor laser illustrated in FIG. 2 is explained.

A negative DC voltage from the reverse bias voltage source 48 and a sine wave modulation voltage from the modulation voltage source 49 are superimposed upon each other and then applied to the P-side electrode 46 for the saturable absorber. The current from the gain area current source 50 is injected into the P-side electrode 47 for the gain area, to provide an optical gain to the laser oscillation light. As a result, the resonator operates while achieving hybrid mode locking and generates an optical pulse train with a low time jitter having undergone a pulse width suppression as in the first embodiment.

When an electrical current, the level of which is determined by the variable resistor 54, is supplied from the ohmic resistance heating film source 53 to the ohmic resistance heating film 52, Joule heat is generated. The Joule heat generated at the ohmic resistance heating film 52 raises the temperature of the passive wave guiding channel 44 to change its refractive index. At this time, the optical length of the resonator in the semiconductor laser changes and, as a result, the mode locking frequency also changes. Since the optical loss at the passive wave guiding channel 44 remains unchanged even when the refractive index changes, the pulse characteristics such as the pulse width and the pulse intensity do not change either. Thus, only the mode locking pulse frequency changes.

As in the first embodiment, a phase difference is created between the modulation signal with the reference frequency generated by the modulation voltage source 49 and the photoelectric current flowing through the saturable absorber 43 when the mode locking frequency fluctuates due to heat or the like. The phase comparator 57 supplied with the photoelectric current amplified by the amplifier 56 compares the phase of the amplified photoelectric current and the phase of the modulation signal generated by the modulation voltage source 49, detects the frequency deviation in the frequency of the photoelectric current relative to the reference frequency and provides results of the frequency deviation detection to the variable resistor 54. In response, the resistance of the variable resistor 54 is set to a value that will eliminate the frequency deviation, to adjust the current value of the current flowing through the ohmic resistance heating film 52. As a result, the refractive index of the passive wave guiding channel 44 changes so as to suppress change in the mode locking frequency.

As described above, in the second embodiment, the mode locking semiconductor laser having the ohmic resistance heating film 52 over the passive wave guiding channel 44 is provided with the phase comparator 57 and the variable resistor 54. The phase comparator 57 detects the deviation of the frequency of the photoelectric current flowing through the saturable absorber 43 relative to the reference frequency. The variable resistor 54 controls the current flowing through the ohmic resistance heating film 52 based upon the output signal from the phase comparator 57 so as to eliminate the deviation of the photoelectric current frequency relative to the reference frequency. Even when the mode locking frequency changes, a current which suppresses the change is supplied to the ohmic resistance heating film 52 by employing these components. Thus, the mode locking frequency is stabilized, and a stable, ultra short optical pulse train is generated over a long period of time. Consequently, advantages such as prevention of erroneous signal identification in an optical communications system, for instance, can be achieved as in the first embodiment. In addition, since the optical coupler 28, the O/E converter 29 and the like required in the first embodiment do not need to be provided, the number of components can be reduced and miniaturization is achieved.

Third Embodiment

Figure 3:
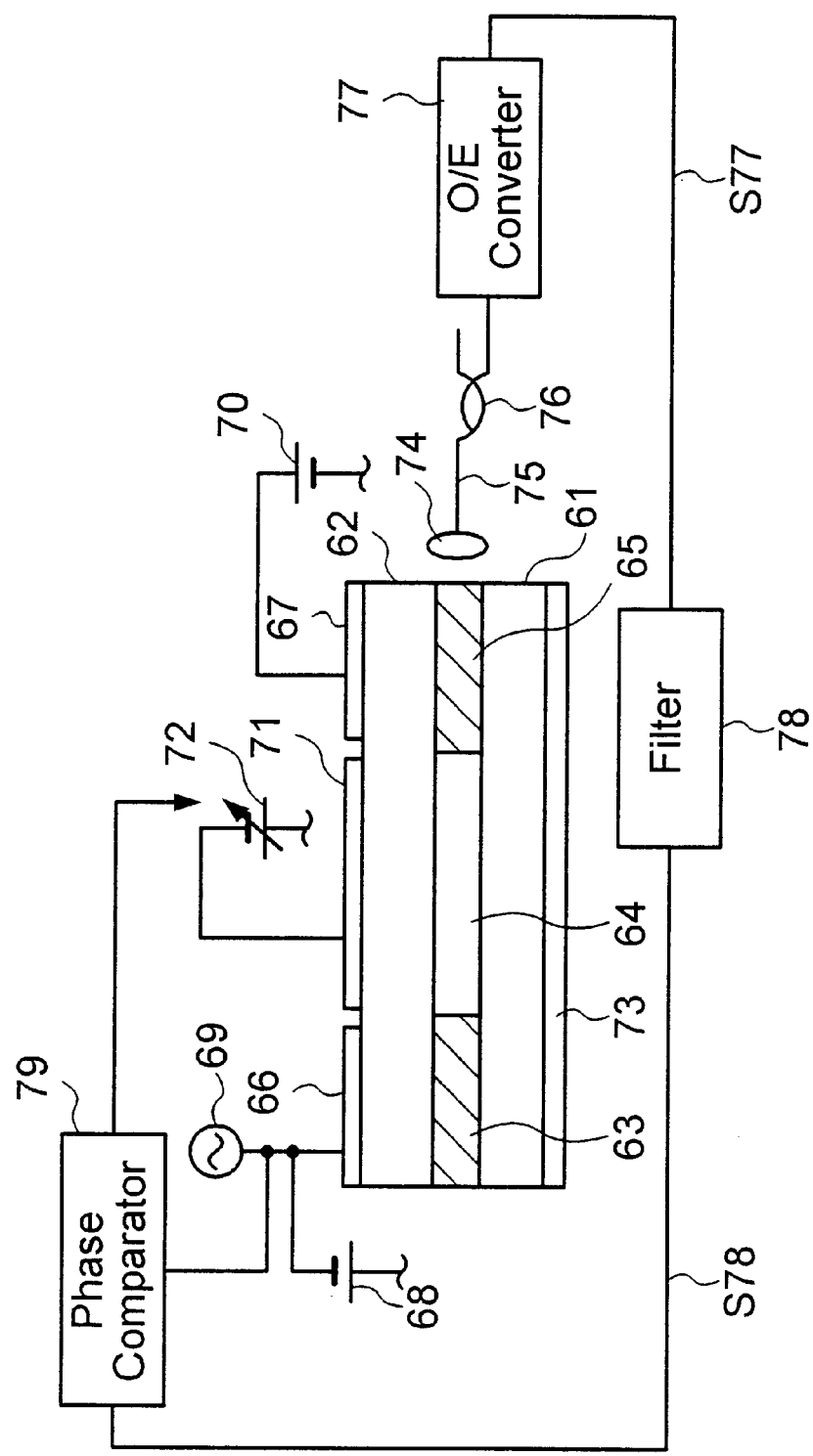
FIG. 3 is a block diagram of the mode locking semiconductor laser in the third embodiment of the present invention.

FIG. 3 is a block diagram of a portion of the mode locking semiconductor laser in the third embodiment of the present invention.

This mode locking semiconductor laser, which outputs an ultra short optical pulse train, is provided with a saturable absorber 63, a passive wave guiding channel 64 and a gain area 65 enclosed by a lower N-type clad layer 61 and an upper P-type clad layer 62 to constitute a resonator. The saturable absorber 63 and the gain area 65 are each constituted of an active wave guiding channel. The passive wave guiding channel 64, which achieves a band gap wavelength that is sufficiently shorter than the wavelength of the laser oscillation light, is transparent to the laser oscillation light and is provided between the saturable absorber 63 and the gain area 65.

A P-side electrode 66 for the saturable absorber is formed at the surface of the P-type clad layer 62 at a position over the saturable absorber 63. A P-side of a electrode 67 for the gain area is formed at the surface of the P-type clad layer 62 at a position over the gain area 65. A reverse bias voltage source 68 and a modulation voltage source 69 that generates a modulation signal at the reference frequency are connected to the P-side electrode 66 for the saturable absorber. A gain area current source 70 is connected to the P-side electrode 67 for the gain area. A P-side electrode 71 for the passive wave guiding channel is formed at the surface of the P-type clad layer 62 above the passive wave guiding channel 64 and is connected with a passive wave guiding channel reverse bias voltage source 72. A common electrode 73 is formed over the entire rear surface of the N-type clad layer 61. The P-type clad layer 62, the N-type clad layer 61 and the passive wave guiding channel 64 constitute a p/i/n junction.

At the side surface of the semiconductor laser toward the gain area 65, an optical coupling lens 74 is provided to couple the gain area 65 and a pigtail optical fiber 75. An optical coupler 76 is provided on the output side of the pigtail optical fiber 75. The optical coupler 76 is provided with two output terminals, through one of which the light output from the semiconductor laser is output to the outside and through the other of which light is delivered to an O/E converter 77. The output side of the O/E converter 77 is connected to a filter 78, with the output side of the filter 78 connected to one of the input terminals at a 2-input phase comparator 79. The filter 78 allows the frequency component corresponding to the mode locking frequency to pass. The other input terminal of the phase comparator 79 is connected to the output terminal of the modulation voltage source 69. The output terminal of the phase comparator 79 is connected to a passive wave guiding channel reverse bias voltage source 72. The passive wave guiding channel reverse bias voltage source 72 connected to the phase comparator 79 in this manner applies a control voltage that eliminates the phase difference between the output signal from the filter 78 and the modulation signal with the reference frequency generated by the modulation voltage source 69 to the passive wave guiding channel 64 to adjust the refractive index of the passive wave guiding channel 64.

Next, the operation achieved in the mode locking semiconductor laser illustrated in FIG. 3 is explained.

A negative DC voltage from the reverse bias voltage source 68 and a sine wave modulation voltage from the modulation voltage source 69 are superimposed upon each other and then applied to the P-side electrode 66 for the saturable absorber. The current from the gain area current source 70 is injected into the P-side electrode 67 for the gain area, to provide an optical gain to the laser oscillation light. As a result, an optical pulse train with a low time jitter having undergone a pulse width suppression is generated through a hybrid mode locking operation. The optical pulse train is output to the outside via the lens 74, the pigtail optical fiber 75 and the optical coupler 76, and is also input to the O/E converter 77. Having the optical pulse train input therein, the O/E converter 77 outputs an electrical signal S77 with a frequency corresponding to the cyclic frequency of the optical pulse train to the filter 78. The filter 78 allows a component S78 of the signal S77 corresponding to the mode locking frequency to pass and provides it to the phase comparator 79.

When the reverse bias voltage is applied to the P-side electrode 71 for the passive wave guiding channel from the passive wave guiding channel reverse bias voltage source 72, the refractive index of the passive wave guiding channel 64 changes due to the Pockels effect. At this time, the optical length of the resonator in the semiconductor laser changes and, as a result, the mode locking frequency also changes. Since the optical loss at the passive wave guiding channel 64 remains unchanged even when the refractive index changes, the pulse characteristics such as the pulse width and the pulse intensity do not change either. Thus, only the mode locking pulse frequency changes.

When the mode locking frequency fluctuates due to heat or the like, a difference occurs between the frequency at the modulation voltage source 69 and the frequency of the component S78. The phase comparator 79 detects the difference between the frequency at the modulation voltage source 69 and the frequency of the component S78. Then, the voltage from the passive wave guiding channel reverse bias voltage source 72 changes so as to correct the phase difference between them. Consequently, the refractive index of the passive wave guiding channel 64 changes to suppress a change in the mode locking frequency.

As described above, in the third embodiment, the mode locking semiconductor laser having the passive wave guiding channel reverse bias voltage source 72 is provided with the O/E converter 77, the filter 78 and the phase comparator 79. When the mode locking frequency changes, the voltage at the passive wave guiding channel reverse bias voltage source 72 is changed to suppress this change by employing these components. Thus, the mode locking frequency is stabilized, and a stable, ultra short optical pulse train is generated over a long period of time. Consequently, advantages such as prevention of erroneous signal identification in an optical communications system, for instance, can be achieved.

Fourth Embodiment

Figure 4:
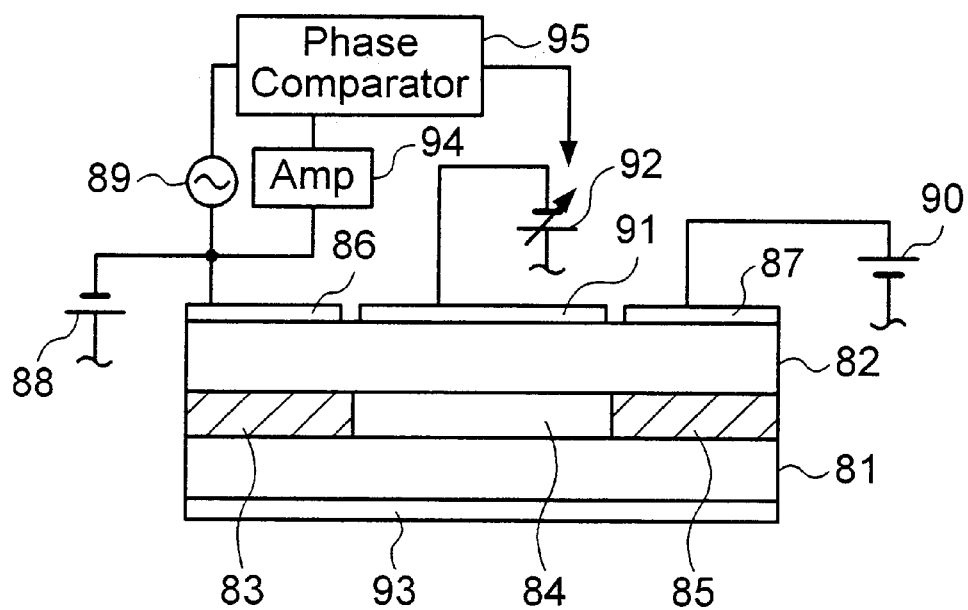
FIG. 4 is a block diagram of the mode locking semiconductor laser in the fourth embodiment of the present invention.

FIG. 4 is a block diagram a of the mode locking semiconductor laser in the fourth embodiment of the present invention;

This mode locking semiconductor laser, which outputs an ultra short optical pulse train, is provided with a saturable absorber 83, a passive wave guiding channel 84 and a gain area 85 enclosed by a lower N-type clad layer 81 and a P-type clad layer 82 to constitute a resonator, as in the third embodiment. The saturable absorber 83 and the gain area 85 are each constituted of an active wave guiding channel. The passive wave guiding channel 84, which achieves a band gap wavelength that is sufficiently shorter than the wavelength of the laser oscillation light, is transparent to the laser oscillation light and is provided between the saturable absorber 83 and the gain area 85.

A P-side electrode 86 for the saturable absorber is formed at the surface of the P-type clad layer 82 at a position over the saturable absorber 83. A P-side electrode 87 for the gain area is formed at the surface of the P-type clad layer 82 at a position over the gain area 85. A reverse bias voltage source 88 and a modulation voltage source 89 are connected to the P-side electrode 86 for the saturable absorber. The modulation voltage source 89 applies a modulation signal with a reference frequency to the saturable absorber 83 via the P-type clad layer 82. A gain area current source 90 is connected to the P-side electrode 87 for the gain area. A P-side electrode 91 for the passive wave guiding channel is formed at the surface of the P-type clad layer 82 over the passive wave guiding channel 84 and is connected with a passive wave guiding channel reverse bias voltage source 92. A common electrode 93 is formed over the entire rear surface of the N-type clad layer 81. The P-type clad layer 82, the N-type clad layer 81 and the passive wave guiding channel 84 constitute a p/i/n junction.

The mode locking semiconductor laser is further provided with an amplifier (Amp) 94 that detects and amplifies the photoelectric current flowing through the saturable absorber 83. The output side of the amplifier 94 is connected to one of the input terminals of a phase comparator 95 having two input terminals. The other input terminal of the phase comparator 95 is connected to the modulation voltage source 89. The output side of the phase comparator 95 is connected to the passive wave guiding channel reverse bias voltage source 92. The passive wave guiding channel reverse bias voltage source 92 connected to the phase comparator 95 in this manner applies a control voltage that will eliminate the phase difference between the photoelectric current flowing through the saturable absorber 83 and the modulation signal at the reference frequency generated by the modulation voltage source 89 to the passive wave guiding channel 84.

Next, the operation achieved in the mode locking semiconductor laser illustrated in FIG. 4 is explained.

A negative DC voltage from the reverse bias voltage source 88 and a sine wave modulation voltage from the modulation voltage source 89 are superimposed upon each other and then applied to the P-side electrode 86 for the saturable absorber. The current from the gain area current source 90 is injected into the P-side electrode 87 for the gain area to provide an optical gain to the laser oscillation light. As a result, the resonator operates while achieving hybrid mode locking and generates an optical pulse train with a low time jitter having undergone a pulse width suppression as in the third embodiment.

When the reverse bias voltage is applied to the P-side electrode 91 for the passive wave guiding channel from the passive wave guiding channel reverse bias voltage source 92, the refractive index of the passive wave guiding channel 84 changes due to the Pockels effect. At this time, the optical length of the resonator in the semiconductor laser changes and, as a result, the mode locking frequency also changes. Since the optical loss at the passive wave guiding channel 84 remains unchanged even when the refractive index changes, the pulse characteristics such as the pulse width and the pulse intensity do not change either, and thus, only the mode locking pulse frequency changes.

As in the third embodiment, when the mode locking frequency fluctuates due to heat or the like, a phase difference is created between the modulation signal at the reference frequency generated by the modulation voltage source 89 and the photoelectric current flowing through the saturable absorber 83. The photoelectric current is amplified by the amplifier 94 and is provided to the phase comparator 95. The phase comparator 95 compares the phase of the photoelectric current and the phase of the modulation signal generated by the modulation voltage source 89 to detect the frequency deviation of the photoelectric current frequency relative to the reference frequency, and provides the results of the frequency deviation detection to the passive wave guiding channel reverse bias voltage source 92. In response, the reverse bias voltage source 92 applies the control voltage which will eliminate the frequency deviation to the passive wave guiding channel 84. As a result, the refractive index of the passive wave guiding channel 84 changes so as to suppress change in the mode locking frequency.

As described above, in the fourth embodiment, the mode locking semiconductor laser having the passive wave guiding channel reverse bias voltage source 72 is provided with the phase comparator 95 that detects the deviation of the frequency of the photoelectric current flowing through the saturable absorber 83 relative to the reference frequency. Since the control voltage that will eliminate the deviation of the frequency of the photoelectric current relative to the reference frequency is applied to the passive wave guiding channel 84 in conformance to the output signal from the phase comparator 95, the mode locking frequency is stabilized, and a stable, ultra short optical pulse train is generated over a long period of time, as in the third embodiment. Thus, the advantages such as prevention of erroneous signal identification in an optical communication system are realized. Moreover, since the optical coupler 76, the O/E converter 77 and the like required in the third embodiment do not need to be provided, the number of required components is reduced and miniaturization is achieved.

It is to be noted that the present invention is not limited to the embodiments and it may be adopted in a number of variations.

For instance, the passive wave guiding channels 14, 44, 64 and 84 do not need to be provided at the center of the individual optical resonators, and they each may be located at an end of the optical resonator. In addition, the current injected into the ohmic resistance heating films 22 and 52 may be changed by other means for changing such as by changing the voltage generated by the sources 23 and 53 respectively instead of via the variable resistors 24 and 54. The ohmic resistance heating films may be constituted of a material other than Pt or Ti.

As explained in detail above, in the first embodiment of the present invention, an O/E converter that converts an ultra short optical pulse train to an electrical signal and a phase comparator that compares the phase of the electrical signal and the phase of the modulation signal at the reference frequency and detects the deviation of the frequency of the ultra short optical pulse train relative to the reference frequency based upon the phase difference between them are provided in the mode locking semiconductor laser having an ohmic resistance heating film formed therein, and the current injected into the ohmic resistance heating film is changed to eliminate the frequency deviation. As a result, even if a disturbance occurs due to heat or the like, the optical length is adjusted to stabilize the mode locking frequency and to generate a stable ultra short optical pulse train over a long period of time. Thus, advantages such as prevention of erroneous signal identification in an optical communications system, for instance, are realized.

In the second embodiment of the present invention, the mode locking semiconductor laser having an ohmic resistance heating film formed therein is provided with a phase comparator that compares the phase of the photoelectric current flowing through the active wave guiding channel and the phase of the modulation signal applied to the active wave guiding channel and detects the deviation of the frequency of the photoelectric current relative to the reference frequency based upon the phase difference between them, and the current injected into the ohmic resistance heating film is changed so as to eliminate the frequency deviation. Thus, as in the first embodiment of the present invention, even when a disturbance occurs due to heat or the like, the optical length is adjusted to stabilize the mode locking frequency and to generate a stable ultra short optical pulse train over a long period of time. In addition, since the feedback system constituted of the O/E converter which converts the optical pulse train to an electrical signal and the like is no longer required, a reduction in the number of required components and miniaturization are achieved with ease, thereby realizing a reduction in production costs.

In the third embodiment of the present invention, the mode locking semiconductor laser, with a control voltage that changes the refraction index of the passive wave guiding channel to change the optical length applied to the passive wave guiding channel is provided with an O/E converter that converts an ultra short optical pulse train to an electrical signal and a phase comparator that compares the phase of the electrical signal and the phase of the modulation signal and detects the deviation of the frequency of the ultra short optical pulse train relative to the reference frequency in correspondence to the phase difference between them, and the control voltage is changed so as to eliminate the frequency deviation. As a result, even when a disturbance occurs due to heat or the like, the optical length is adjusted to stabilize the mode locking frequency and to generate a stable ultra short optical pulse train over a long period of time as in the first aspect of the invention. Thus, advantages such as prevention of erroneous signal identification in an optical communications system, for instance, are realized.

In the fourth embodiment of the present invention, the mode locking semiconductor laser, with a control voltage that changes the refractive index of the passive wave guiding channel to change the optical length applied to the passive wave guiding channel is provided with a phase comparator that compares the phase of the photoelectric current flowing through the active wave guiding channel and the phase of the modulation signal applied to the active wave guiding channel and detects the frequency deviation of the photoelectric current relative to the modulation signal in correspondence to the phase difference between them, and the control voltage is changed so as to eliminate the frequency deviation. Thus, as in the third aspect of the invention, even when a disturbance occurs due to heat or the like, the optical length is adjusted to stabilize the mode locking frequency and to generate a stable ultra short optical pulse train over a long period of time. In addition, since the feedback system constituted of the O/E converter that converts the optical pulse train to an electrical signal and the like is no longer required, and a reduction in the number of required components and miniaturization are achieved with ease to realize a reduction in production costs.

The entire disclosure of Japanese Patent Application No. 11-142684 filed on May 24, 1999 including specification, claims, drawings and summary is incorporated herein by reference in its entirety.

What is claimed is:

1. A mode locking semiconductor laser, comprising:
   a semiconductor laser that generates an ultra short optical pulse train with a frequency corresponding to a reference frequency and has an optical resonator including an active waveguide channel to which a modulation signal with said reference frequency is applied, a passive waveguide channel that is transparent with respect to oscillation light, and an ohmic resistance heating film provided over said passive waveguide channel, that generates Joule heat corresponding to an electrical current injected thereto and changes the refractive index of said passive waveguide channel to change the optical length of the optical resonator and the frequency of the pulse train;
   a photoelectric transducer that converts said ultra short optical pulse train to an electrical signal;
   a phase comparator that compares the phase of said electrical signal and the phase of said modulation signal and detects a frequency deviation of said ultra short optical pulse train relative to the reference frequency based upon the phase difference therebetween; and
   means for changing the electrical current injected into said ohmic resistance heating film so as to eliminate the frequency deviation detected by said phase comparator.

2. A mode locking semiconductor laser according to claim 1, wherein:
   said ohmic resistance heating film is constituted of Pt (platinum).

3. A mode locking semiconductor laser according to claim 1, wherein:
   said ohmic resistance heating film is constituted of Ti (titanium).

4. A mode locking semiconductor laser according to claim 1, wherein:
   said means for changing the injected electrical current includes a variable resistor.

5. A mode locking semiconductor laser according to claim 1, wherein:
   said means for changing the injected electrical current includes a source voltage which generates the injected electrical current.

6. A mode locking semiconductor laser according to claim 1, further comprising a filter coupled to an input of said phase comparator that allows a frequency component corresponding to a mode locking frequency of said electrical signal to pass.

7. A mode locking semiconductor laser, comprising;
   a semiconductor laser that generates an ultra short optical pulse train with a frequency corresponding to a reference frequency and has an optical resonator including an active waveguide channel to which a modulation signal with said reference frequency is applied, a passive waveguide channel that is transparent with respect to oscillation light, and an ohmic resistance heating film provided over said passive waveguide channel, that generates Joule heat corresponding to an electrical current injected thereto and changes the refractive index of said passive waveguide channel to change the optical length of the optical resonator and the frequency of the pulse train;
   a phase comparator that compares the phase of a photoelectric current flowing through said active waveguide channel and the phase of said modulation signal applied to said active waveguide channel and detects a frequency deviation of said photoelectric current relative to said modulation signal based upon the phase difference therebetween; and
   means for changing the electrical current injected into said ohmic resistance heating film so as to eliminate the frequency deviation detected by said phase comparator.

8. A mode locking semiconductor laser according to claim 7, wherein:
   said ohmic resistance heating film is constituted of Pt (platinum).

9. A mode locking semiconductor laser according to claim 7, wherein:
   said ohmic resistance heating film is constituted of Ti (titanium).

10. A mode locking semiconductor laser according to claim 7, wherein:
    said means for changing the injected electrical current includes a variable resistor.

11. A mode locking semiconductor laser according to claim 7, wherein:
    said means for changing the injected electrical current includes a source voltage which generates the injected electrical current.

12. A mode locking semiconductor laser according to claim 7, further comprising;

an amplifier coupled to an input of said phase comparator that amplifies the photoelectric current flowing through said active wave guiding channel.

13. A mode locking semiconductor laser, comprising:

a semiconductor laser that generates an ultra short optical pulse train with a frequency corresponding to a reference frequency as has an optical resonator including;
  an active waveguide channel to which a modulation signal with said reference frequency is applied, and
  a passive waveguide channel that is transparent to oscillation light, with a control voltage that changes the refractive index of said passive waveguide channel to change the optical length applied to said passive waveguide channel and the frequency of the pulse train;

a photoelectric transducer that converts the ultra short optical pulse train to an electrical signal;

a phase comparator that compares the phase of said electrical signal and the phase of said modulation signal and detects a frequency deviation of said ultra short optical pulse train relative to said reference frequency based upon the phase difference therebetween; and means for changing said control voltage so as to eliminate said frequency deviation detected by said phase comparator.

14. A mode locking semiconductor laser according to claim 13, further comprising:

a filter coupled to an input of said phase comparator that allows a frequency component corresponding to a mode locking frequency of said electrical signal to pass.

15. A mode locking semiconductor laser, comprising;

a semiconductor laser that generates an ultra short optical pulse train with a frequency corresponding to a reference frequency and has an optical resonator including;
  an active waveguide channel to which a modulation signal with said reference frequency is applied, and
  a passive waveguide channel that is transparent to oscillation light, with a control voltage that changes the refractive index of said passive waveguide channel to change the optical length applied to said passive waveguide channel and the frequency of the pulse train;

a phase comparator that compares the phase of a photoelectric current flowing through said active wave guiding channel and the phase of said modulation signal applied to said active wave guiding channel and detects a frequency deviation of said photoelectric current relative to said modulation signal based upon the phase difference therebetween; and means for changing said control voltage so as to eliminate said frequency deviation detected by said phase comparator.

16. A mode locking semiconductor laser according to claim 15, further comprising an amplifier coupled to an input of said phase comparator that amplifies said photoelectric current flowing through said active wave guiding channel.

* * * * *